US010683565B2

(12) United States Patent
Kiss

(10) Patent No.: US 10,683,565 B2
(45) Date of Patent: Jun. 16, 2020

(54) METHOD OF RECLAIMING CADMIUM AND TELLURIUM FROM CDTE FOR CDTE PHOTOVOLTAIC MODULES

(71) Applicant: Zoltan J. Kiss, Budapest (HU)

(72) Inventor: Zoltan J. Kiss, Budapest (HU)

( * ) Notice: Subject to any disclaimer, the term of this patent is extended or adjusted under 35 U.S.C. 154(b) by 0 days.

(21) Appl. No.: 15/953,850

(22) Filed: Apr. 16, 2018

(65) Prior Publication Data

US 2019/0316224 A1    Oct. 17, 2019

(51) Int. Cl.
| | |
|---|---|
| *C22B 17/00* | (2006.01) |
| *C22B 3/00* | (2006.01) |
| *C22B 7/00* | (2006.01) |
| *H01L 31/042* | (2014.01) |
| *H01L 31/0296* | (2006.01) |

(52) U.S. Cl.
CPC .............. *C22B 17/04* (2013.01); *C22B 7/007* (2013.01); *H01L 31/0296* (2013.01); *H01L 31/042* (2013.01)

(58) Field of Classification Search
CPC ................ C22B 7/006–008; C22B 17/04
USPC ........................ 423/101–106; 75/711, 715
See application file for complete search history.

(56) References Cited

U.S. PATENT DOCUMENTS

| | | | | |
|---|---|---|---|---|
| 4,053,553 A | * | 10/1977 | Reinhardt ............... | C22B 17/04 423/105 |
| 4,370,233 A | | 1/1983 | Hayes et al. | |
| 5,405,588 A | * | 4/1995 | Kronberg ................. | C01G 1/12 106/452 |
| 5,779,877 A | * | 7/1998 | Drinkard, Jr. ........... | C22B 7/007 205/557 |
| 5,897,685 A | * | 4/1999 | Goozner ................. | C22B 3/065 75/711 |
| 5,997,718 A | | 12/1999 | Goozner et al. | |
| 8,821,711 B2 | * | 9/2014 | Taylor ...................... | C25C 1/16 205/560 |
| 2009/0095127 A1 | * | 4/2009 | Patterson ................ | C22B 7/005 75/10.18 |
| 2012/0024108 A1 | | 2/2012 | Patterson | |

FOREIGN PATENT DOCUMENTS

| | | |
|---|---|---|
| CN | 1166862 | 12/1997 |
| CN | 103740945 | 4/2014 |
| CN | 103924095 | 5/2016 |
| CN | 205347081 | 6/2016 |
| CN | 104805289 | 9/2016 |
| CN | 106277513 | 1/2017 |

OTHER PUBLICATIONS

Tolley et al, Pollution prevention for process engineering proceedings of technical solutions for pollution prevention in the mining and mineral processing industries, an Engineering foundation conference, Palm Coast, FL, Jan. 22-27, 1995. (Year: 1995).*

* cited by examiner

*Primary Examiner* — Steven J Bos
(74) *Attorney, Agent, or Firm* — Gearhart Law LLC

(57) ABSTRACT

A method of reclaiming cadmium material from photovoltaic (PV) modules is provided. The method includes submerging one or more portions of a PV module in a solution including non-distilled water, wherein the one or more portions of the PV module are submerged until cadmium material present on the PV module dissolves into the solution, boiling the solution until the dissolved cadmium material precipitates, and collecting the precipitated cadmium material.

7 Claims, 4 Drawing Sheets

METHOD OF RECLAIMING CADMIUM AND TELLURIUM FROM CDTE FOR CDTE PHOTOVOLTAIC MODULES

CLAIM OF PRIORITY

This application is a United States non-provisional application and claims no priority to any previous United States patent or patent application.

FIELD OF THE EMBODIMENTS

This invention relates to cadmium extraction and removal and, in particular, to the extraction and removal of cadmium and cadmium compounds from photovoltaic cells.

BACKGROUND OF THE EMBODIMENTS

Cadmium and, in particular, cadmium telluride (CdTe) are gaining a substantially increased role in global energy production and are a component of many solar panels. The environmental safety concern of cadmium leaching out of CdTe solar panels has become a critical issue. Recent studies show that naturally occurring groundwater and rainwater dissolve CdTe at a very fast rate, allowing cadmium to enter the groundwater at concentrations at least four orders of magnitude greater than the EPA allowed limits for drinking water.

Recent studies have also demonstrated that water travels by capillary action between the various layers in a typical photovoltaic (PV) module structure, thus leading to delamination and contamination by cadmium at an even faster rate than has otherwise been anticipated. The behavior of the cadmium leaching out of CdTe PV solar panels makes it imperative not to discard rejected CdTe solar modules/panels in dumps or landfills.

CdTe-based photovoltaic modules have gained a market penetration of approximately ten percent of the existing PV market. In 2010, this proliferation represented an annual manufacturing capacity of approximately two gigawatts and an installed capacity by the end of 2010 of approximately five gigawatts. Unless further manufacture of CdTe is curtailed, a cumulative installed capacity of approximately 50 gigawatts is possible by 2020. This increase means that 100,000 hectares or 1,000 square kilometers would be covered with this cadmium containing photovoltaic material. Approximately 5,000 tons of water-soluble carcinogenic CdTe would thereby be spread over the 1,000 square kilometers of land area.

Cadmium has been established by several international agencies as one of the most carcinogenic materials. The "Restrictions of Hazardous Substances" Directive (RoHS) was signed by many nations including the European Community, China, Japan, and India. In the European Community, however, the promoters of CdTe have managed to get an exemption from the Directive for CdTe photovoltaics. Some other countries, such as Japan, China, and India, continue to ban CdTe. In Europe and the United States, CdTe-based PV modules are heavily marketed. In 2010, for example, the industry sold approximately 2 gigawatts of CdTe-based modules. The initial exemption in Europe depended heavily on white papers published in the United States by NREL personnel and some other related institutions, such as Brookhaven National Laboratory. Those papers claimed that CdTe is not water-soluble. Also, the manufacturers of the modules declared that the installed modules would be dismantled at the end of their useful live (20-30 years) and that all cadmium would be subsequently reclaimed. To pay for this cost, the manufacturer sets aside approximately $0.015 per watt. Keeping in mind the magnitude of the problem and the danger to humans and other living things, these two fundamental assumptions have been examined: the water solubility of cadmium from modules, and the cost and responsibility for recycling.

The makers of CdTe photovoltaic modules do not acknowledge the toxic and carcinogenic properties of cadmium and have therefore promised that when the modules reach the end of their useful life they will not de-mount them, pack them, ship them "home" and salvage the cadmium. Some companies have set up funds which are supposed to cover the cost of doing so even though that cost would nearly equal that of delivering and installing the modules in the first place. History has shown us, though, that such promises, however vociferously advertised, are not always fulfilled, especially when they involve projections of 25 to 30 years into the future.

A method of efficiently removing the cadmium from the PV modules is thus needed to aid in the prevention of cadmium-based pollution.

U.S. Pat. No. 5,405,588 generally describes a process for the recovery of a metal, in particular, cadmium contained in scrap, in a stable form. The process comprises the steps of mixing the cadmium-containing scrap with an ammonium carbonate solution, preferably at least a stoichiometric amount of ammonium carbonate, and/or free ammonia, and an oxidizing agent to form a first mixture so that the cadmium will react with the ammonium carbonate to form a water-soluble ammine complex; evaporating the first mixture so that ammine complex dissociates from the first mixture leaving carbonate ions to react with the cadmium and form a second mixture that includes cadmium carbonate; optionally adding water to the second mixture to form a third mixture; adjusting the pH of the third mixture to the acid range whereby the cadmium carbonate will dissolve; and adding at least a stoichiometric amount of sulfide, preferably in the form of hydrogen sulfide or an aqueous ammonium sulfide solution, to the third mixture to precipitate cadmium sulfide. This mixture of sulfide is then preferably digested by heating to facilitate precipitation of large particles of cadmium sulfide. The scrap may be divided by shredding or breaking up to expose additional surface area. Finally, the precipitated cadmium sulfide can be mixed with glass formers and vitrified for permanent disposal.

Examples of related art are described below:

U.S. Pat. No. 4,370,233 generally describes a method for the chemical detoxification of anaerobically digested organic sludge containing toxic heavy metals in insoluble form. A quantity of the sludge is transferred from a conventional anaerobic digester to an insulated reactor vessel where the sludge is mixed and aerated at a rate sufficient to raise the oxidation reduction potential of the sludge to above +300 mv. and to maintain this condition for a period of 6-12 hours during which the heavy metals are converted to their desired oxidation state. The sludge is then acidified under controlled conditions to pH 1.0-3.0 for a period of 6-12 hours to solubilize the heavy metals. Conventional dewatering techniques are used to separate the detoxified, acidic sludge and the acidic, heavy-metal-containing water. The sludge may be neutralized for safe land application, and the metals can be recovered from the water using existing conventional techniques.

U.S. Pat. No. 5,997,718 generally describes a method for extracting and reclaiming metals from scrap CdTe photovoltaic cells and manufacturing waste by leaching the waste with a leaching solution comprising nitric acid and water, skimming any plastic material from the top of the leaching solution, separating the glass substrate from the liquid leachate and electrolyzing the leachate to separate Cd from Te, wherein the Te is deposits onto a cathode while the Cd remains in solution.

U.S. Patent Publication No. 2009/0095127 generally describes a system and process for reclaiming nickel and cadmium from a feed source such as Ni—Cd batteries. The feed source is shredded to produce feed particles, screened to size the particles, magnetically separated to remove non-metallic materials, and induction heated to generate nickel and cadmium products.

None of the art described above addresses all of the issues that the present invention does.

SUMMARY OF THE EMBODIMENTS

According to an aspect of the present invention, a method of reclaiming cadmium material from photovoltaic (PV) modules is provided. The method includes submerging one or more portions of a PV module in a solution including non-distilled water, wherein the one or more portions of the PV module are submerged until cadmium material present on the PV module dissolves into the solution, boiling the solution until the dissolved cadmium material precipitates, and collecting the precipitated cadmium material.

It is an object of the present invention to provide the method of reclaiming the cadmium material from PV modules, wherein the method further includes determining if a glass portion of the PV module has broken into a plurality of pieces.

It is an object of the present invention to provide the method of reclaiming the cadmium material from PV modules, wherein, if the glass portion of the PV module has broken into the plurality of pieces, the one or more portions of the PV module submerged in the solution includes the plurality of pieces.

It is an object of the present invention to provide the method of reclaiming the cadmium material from PV modules, wherein, if the glass portion of the PV module has not broken into the plurality of pieces, the method further includes opening an edge of the PV module and submerging the edge in the solution.

It is an object of the present invention to provide the method of reclaiming the cadmium material from PV modules, wherein the solution is an acidic water solution.

It is an object of the present invention to provide the method of reclaiming the cadmium material from PV modules, wherein the solution is a basic water solution.

It is an object of the present invention to provide the method of reclaiming the cadmium material from PV modules, wherein the cadmium material includes a cadmium compound It is an object of the present invention to provide the method of reclaiming the cadmium material from PV modules, wherein the cadmium compound includes cadmium telluride.

It is an object of the present invention to provide the method of reclaiming the cadmium material from PV modules, wherein the one or more portions of the PV module are submerged for a period of two or more hours.

DESCRIPTION OF THE PREFERRED EMBODIMENTS

Figure 1:
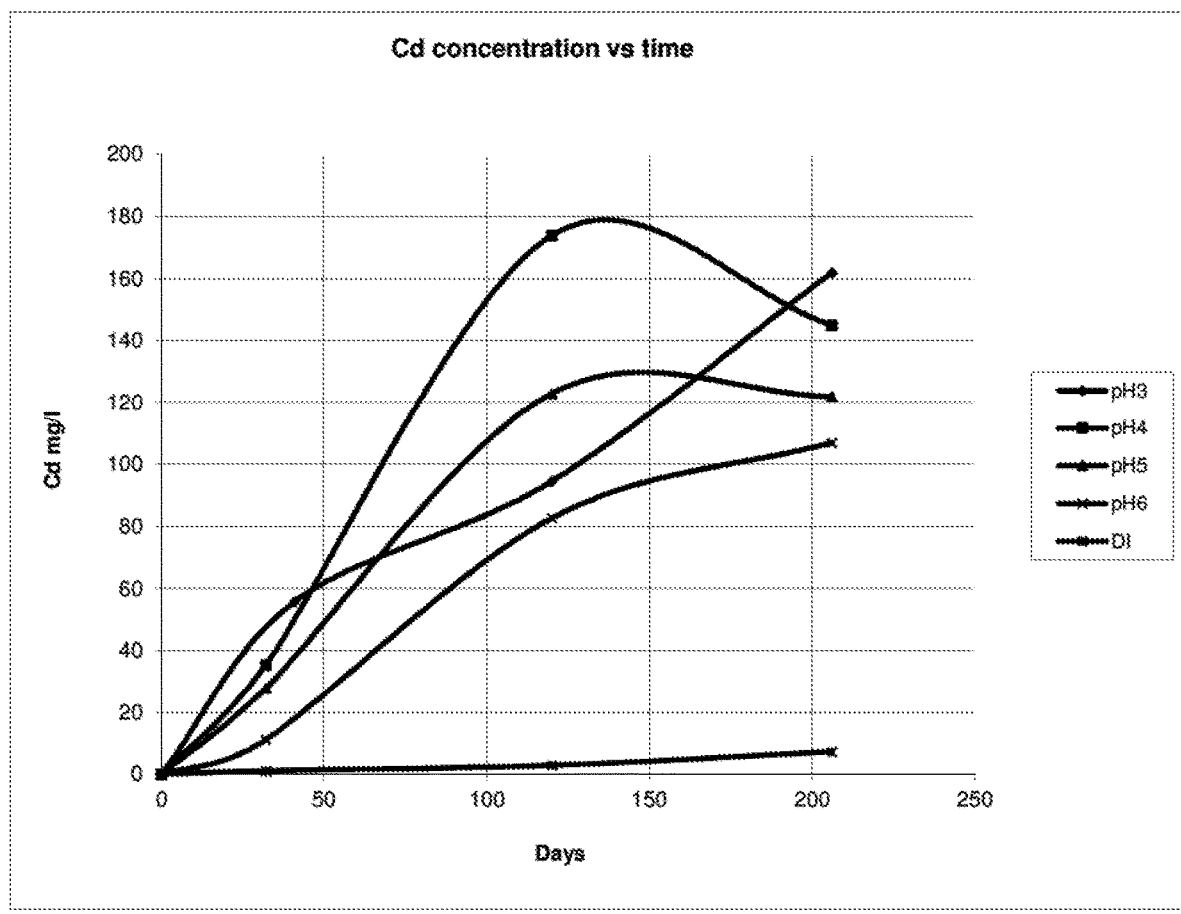
FIG. 1 shows a graphical representation of Cd concentration over time.

The preferred embodiments of the present invention will now be described with reference to the drawings. Identical elements in the various figures are identified with the same reference numerals.

Reference will now be made in detail to each embodiment of the present invention. Such embodiments are provided by way of explanation of the present invention, which is not intended to be limited thereto. In fact, those of ordinary skill in the art may appreciate upon reading the present specification and viewing the present drawings that various modifications and variations can be made thereto.

The possibility that modules will end up in a landfill, broken, and exposed to groundwater has been examined. Some past studies have indicated that dangerous leaching of CD ions from the panels would be minimal, but these studies used only pure water (distilled water) as the leaching solution. In the real world, one is likely to encounter acidic leaching agents, such as, e.g., groundwater or acid rain. The leaching protocol adopted during experimentation addressed the basic problem of how to take into account the conditions of the broken panels that would be anticipated in a landfill. The idea was to "break" the panels as realistically as possible to prepare the samples. Breaking them by impact would closely simulate the "real world," but the breakage patterns would be inherently random and therefore not precisely reproducible from piece to piece nor in successive experiments. On the other hand, slots cut through the front glass with a diamond saw are reproducible, but not entirely realistic.

An investigation included two independent studies, both using approximately 2-inch (50 mm) squares taken from a "First Solar" CdTe module. One set of samples was broken by impact while the other set was slotted with a saw. All samples were kept at normal room temperatures (20 to 25 degrees Celsius) throughout the leaching process. The first study examined five pieces broken by impact. Each square was struck a single blow on the front surface with a 5-ounce cross-peen hammer to induce the kind of breakage that would likely occur when modules are thrown into a landfill. Each sample was then submerged in about 150 ml of leaching solution in a covered 8-ounce Mason jar. One jar contained pure (DI) water. The other four samples were submerged in citric acid-based buffer solutions with pH values of 3, 4, 5, and 6, respectively. These were intended to span the range of acidity one might encounter in actual groundwater as rain seeps into the pile of discarded modules. Initial ICP spectrometry analyses (blanks) of the leaching solutions showed no cadmium with a MDL of about 3 ppb. After 32, 120, and 206 days of submersion, each solution was analyzed for cadmium by ICP emission spectrometry.

The pH of each buffer solution at the end of 206 days was also tested and it was found to still be within 0.1 pH unit of its nominal value.

The pure water, lacking any buffer, had acquired a final pH value of 6.4. The sample in pure water appeared to suffer no additional destruction beyond that caused by the hammer blow, but those in the more acidic solutions underwent increasing degrees of delamination with decreasing pH values. In fact, the samples in pH 3, and 4 solutions were completely delaminated with all of the front glass fragments having settled to the bottom of the jar, and all the active layers were removed. Only the laminating polymer remained attached to the back glass. The samples in pH 5 and 6 solutions had at least 75% of their front glass area delaminated and the underlying active material gone. The analysis results are shown in FIG. 1, which plots cadmium concentration of the solutions versus time for each pH value. Concentrations are in parts per million (mg/l). For reference, the maximum level of Cd permitted by the EPA in drinking water is 5 parts per billion (5 micrograms/liter). It is not clear why for pH 4 the final (206 days) reading is less than the previous one. One possibility is that the cadmium may not have distributed itself uniformly throughout the solution. Another possibility is that there may also have been some adsorption on the EVA plastic after the sample delaminated.

Figure 2:
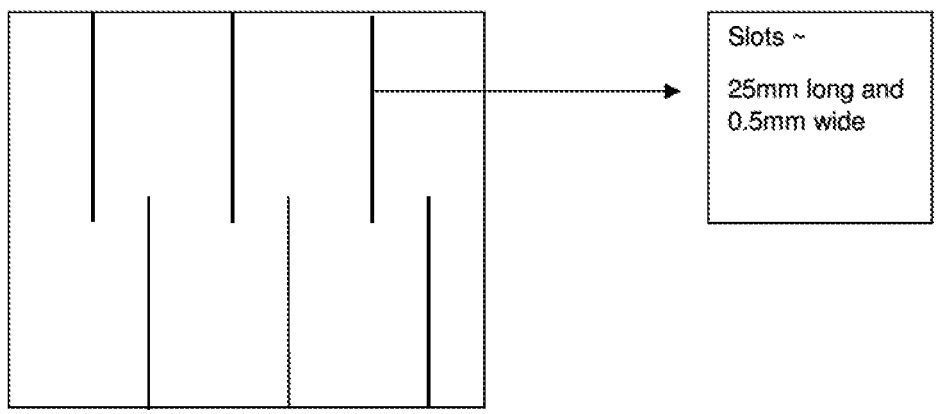
FIG. 2 shows a section of a PV module into which slots are cut.

The leaching solutions, especially the more acidic ones, show cadmium levels 4 orders of magnitude greater than the EPA limit. Thus, even if this experiment does not mimic the conditions in a landfill perfectly, it is hard to argue that the cadmium in CdTe modules is safe against polluting the environment. The other set of tests also used squares from a "First Solar" module approximately 50 mm on a side, but these were carefully cut through the front glass with a diamond saw to make six slots each approximately 25 mm long. All the samples had the same pattern as shown in FIG. 2. Two such samples were immersed in buffer solutions with pH values of 4 and 10, respectively. The pH 4 simulated acid rain, as in the broken-sample tests, while the alkaline solution simulated the properties of some groundwater that passes through calcium salts. The third sample was put into rainwater collected during a storm on 3 Jun. 2010 in Washington, D.C., which had a measured pH of 6.9 (essentially neutral). All three samples were kept in plastic containers with airtight lids and maintained at room temperature. After 7, 10, 14, 21, 30, 45, and 64 days, we withdrew approximately 10 ml specimens of the leaching solution for analysis by DCP-AES to determine the Cd concentrations. To maintain constant solution volume, each sample withdrawn was replaced with 10 ml of fresh solution.

Figure 3:
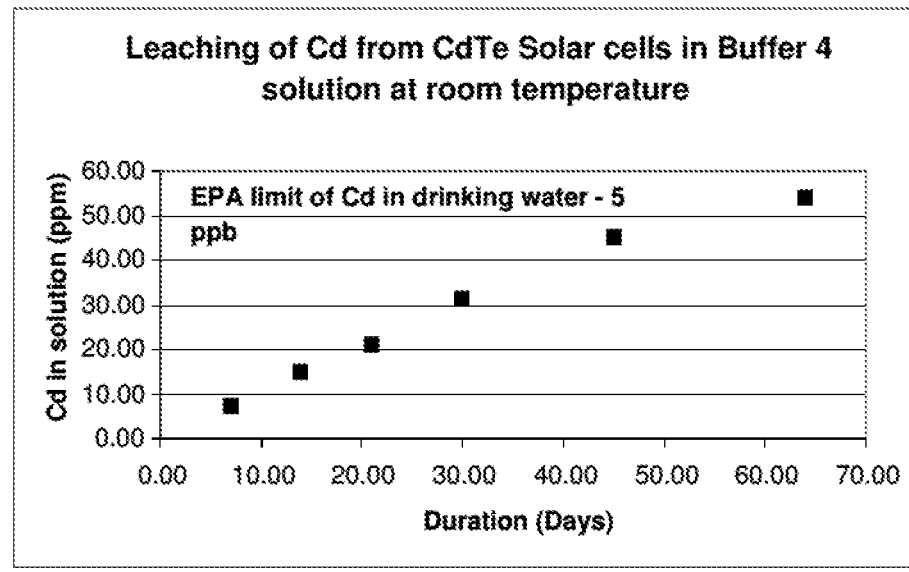
FIG. 3 shows a graphical representation of leaching of Cd from CdTe solar cells in a solution at room temperature.
Figure 4:
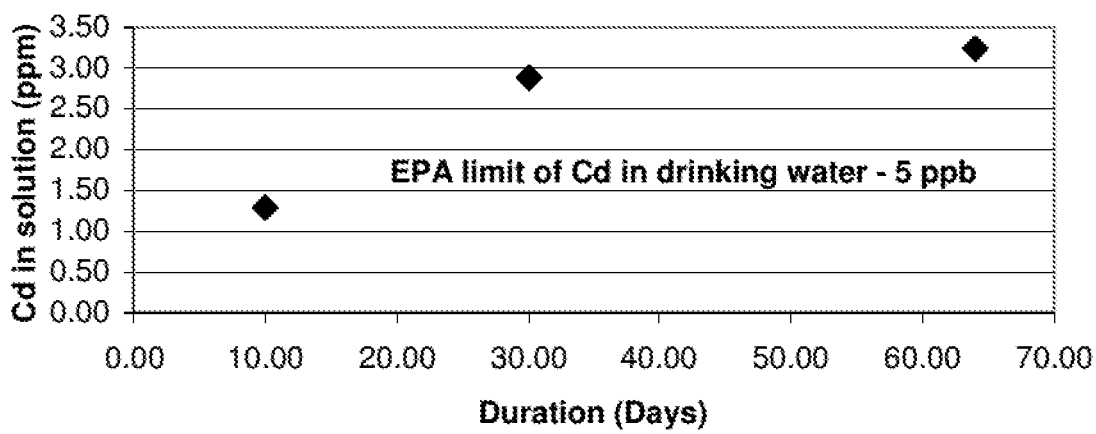
FIG. 4 shows a graphical representation of leaching of Cd from CdTe solar cells in rain water at room temperature.
Figure 5:
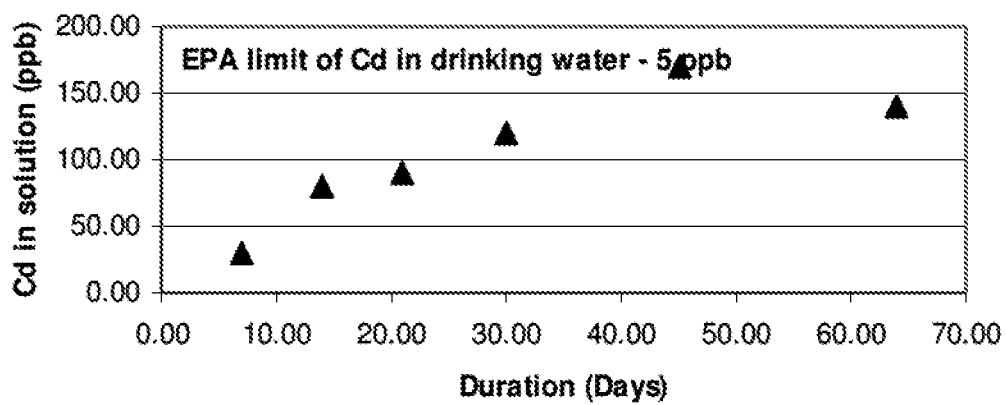
FIG. 5 shows a graphical representation of leaching of Cd from CdTe solar cells in a solution at room temperature.

The results of the analyses are summarized in Table 1, and graphed in FIGS. 3-5. Comparing results, at 64 days the broken sample in pH=4 solution had about 85 mg/l Cd, while the scribed one had 54 mg/l. The difference might be explained by noting that the broken sample had a much closer pattern of cracks so as to expose more of the active layer to the leaching solution. Both, however, had Cd concentrations four orders of magnitude above the EPA limit for drinking water. What is even more striking is that the sample in the alkaline solution with a pH of 10 reached a concentration of 110 mg/l Cd after 64 days. According to NREL's Cadmium Telluride Fact Sheet [ref 5], CdTe PV modules contain between 3 and 10 grams of Cd/m2. The nominal value is 7. So a 5×5 cm (25 cm2) sample would contain about 17.5 mg of Cd. If all of this dissolved in 0.15 liter of solution the concentration would be 117 mg/l.

TABLE 1

Cadmium concentration in solutions for scribed samples in Rain Water, Buffer pH 4, and Buffer pH 10.

| Days | RW (ppm) | B4 (ppm) | B10 (ppb) |
|---|---|---|---|
| 7 |  | 7.10 | 30.00 |
| 10 | 1.30 |  |  |
| 14 |  | 14.79 | 80.00 |
| 21 |  | 20.80 | 90.00 |
| 30 | 2.89 | 31.11 | 120.00 |
| 45 |  | 45.02 | 170.00 |
| 64 |  | 53.86 | 140.00 |

The final concentrations of cadmium given in Table 2 show that at least the majority of this element did leach into solution for the jars with pH values of 3, 4, and 5, and that a significant fraction leached out at pH 6. We were not able to measure the original amounts of cadmium in the samples, but based on the nominal value it should be clear that substantial amounts of the element leach out effectively in all but the pure water. One observation that supports the conclusion that most of the cadmium is being leached is that the concentration-versus-time curves tend to level off after 60 to 100 days. Therefore, it is very probable that in the real world virtually all the cadmium will be leached out within the first year after the modules are dumped.

TABLE 2

Cadmium concentration in ppm (mg/l) of broken leaching samples.

| Days | pH = 3 | pH = 4 | pH = 5 | pH = 6 | DI |
|---|---|---|---|---|---|
| 0 | 0 | 0 | 0 | 0 | 0 |
| 32 |  | 35.4 | 27.8 | 11.1 | 1.11 |
| 41 | 55.8 |  |  |  |  |
| 120 | 94.6 | 174 | 123 | 82.7 | 2.84 |
| 206 | 162 | 145 | 122 | 107 | 7.28 |

Figure 6:
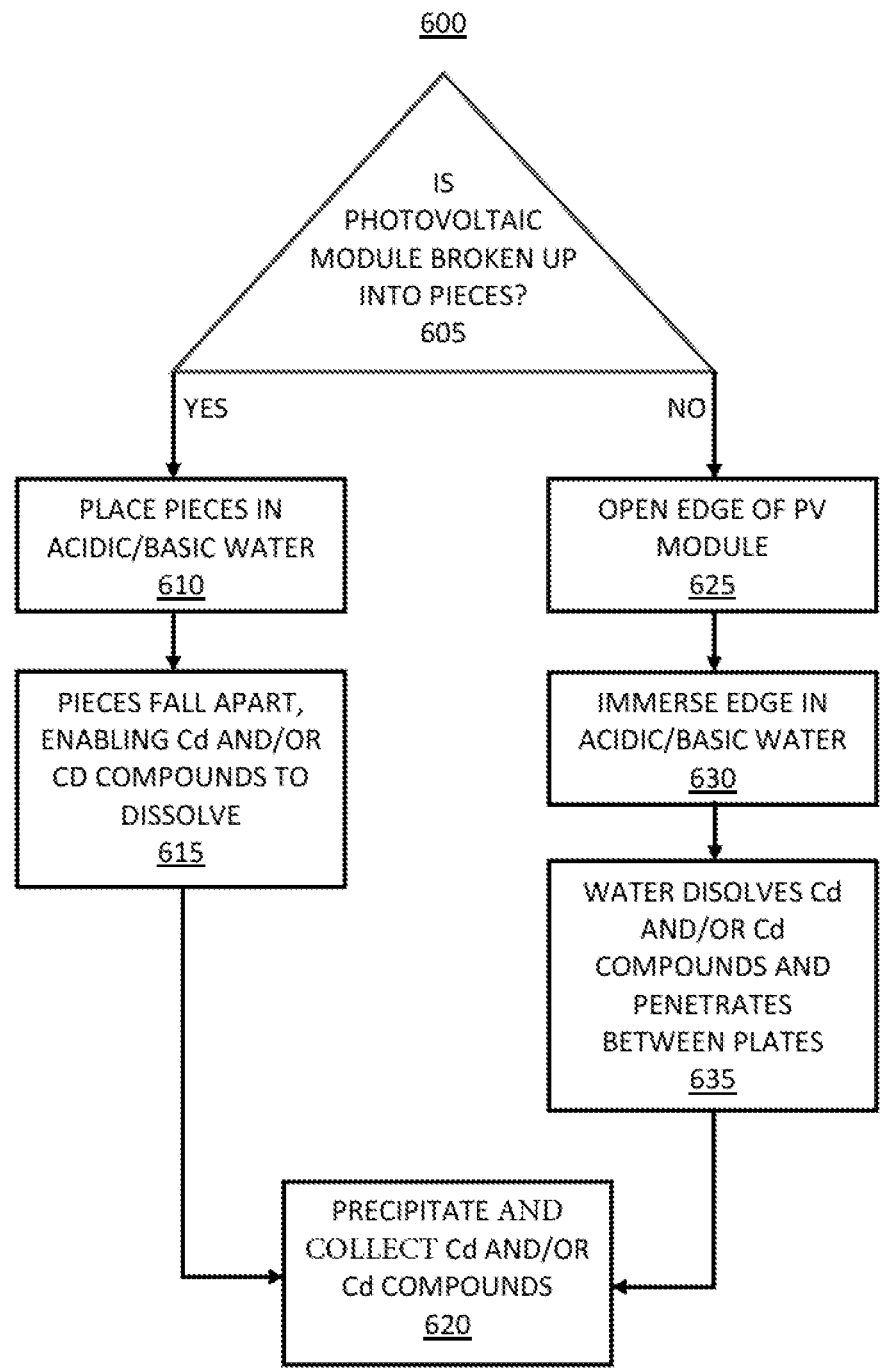
FIG. 6 shows a flow chart of a method for removing cadmium/cadmium compounds from PV modules, according to an embodiment of the present invention.

Referring now to FIG. 6, a flow chart of a method 600 for removing cadmium/cadmium compounds from PV modules is illustratively depicted, in accordance with an embodiment of the present invention.

The conclusion of all the scientific research conducted is that CdTe is very soluble in all forms of water, except distilled water. This property is being used in the present invention to reclaim the carcinogenic CdTe and Cd from PV modules.

At step 605, it is determined whether a PV module (or, e.g., the glass components of the PV module) is broken up into pieces. If the PV module is broken up into pieces, the pieces, at step 610, are placed into water having a fairly high acidic pH or a basic pH.

At step 615, after period of time of two hours or more, the components of the PV module, even encapsulated pieces of the module, fall apart, enabling the CdTe to dissolve in the acidic or base water At step 620, once the Cd or the Cd compound is dissolved, the Cd or Cd compound is precipitated out by the boiling off the water. It is noted, however, that other methods of precipitating the Cd or Cd compound may also be used, while maintaining the spirit of the present invention. According to an embodiment, once precipitated, the precipitated Cd or Cd compound is collected.

If we want to save the glass substrate that the CdTe is deposited on, and the cover plate, we can still reclaim the Cd and CdTe and save the glass pieces in one. This is due to the laminar action of the penetration of the water between the two pieces of glass. This action is also called capillary action. If the PV module is determined, at step 605, to not be broken up into pieces, at step 625, one edge of a sealed CdTe PV module is opened and then, at step 630, this edge is immersed in water having a fairly high acidic pH or a basic pH.

At step 635, the water dissolves the material nearest to it and, by capillary action, moves on to penetrate between the two glass plates. Since the edge of the module is in a volume of water, the water dissolving the CdTe will continuously be diluted and displaced with fresh unsaturated water and, while the capillary action the water traveled throughout the module until the two pieces of glass are separated. The Cd or Cd compound, such as CdTe, is then, at step 620, precipitated out as before.

When introducing elements of the present disclosure or the embodiment(s) thereof the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements.

Although this invention has been described with a certain degree of particularity, it is to be understood that the present disclosure has been made only by way of illustration and that numerous changes in the details of construction and arrangement of parts may be resorted to without departing from the spirit and the scope of the invention.

What is claimed is:

1. A method of reclaiming cadmium material from photovoltaic (PV) modules, comprising:
    submerging one or more portions of a PV module in a citric acid-based buffer solution, wherein the one or more portions of the PV module are submerged until cadmium material present on the PV module dissolves into the citric acid-based buffer solution;
    boiling the citric acid-based buffer solution until the dissolved cadmium material precipitates; and
    collecting the precipitated cadmium material.

2. The method as recited in claim 1, further comprising determining if a glass portion of the PV module has broken into a plurality of pieces.

3. The method as recited in claim 2, wherein, if the glass portion of the PV module has broken into the plurality of pieces, the one or more portions of the PV module submerged in the citric acid-based buffer solution includes the plurality of pieces.

4. The method as recited in claim 2, further comprising:
    if the glass portion of the PV module has not broken into the plurality of pieces:
        opening an edge of the PV module; and
        submerging the edge in the solution.

5. The method as recited in claim 1, wherein the cadmium material includes a cadmium compound.

6. The method as recited in claim 5, wherein the cadmium compound includes cadmium telluride.

7. The method as recited in claim 1, wherein the one or more portions of the PV module are submerged for a period of two or more hours.

* * * * *